(12) United States Patent
Leung

(10) Patent No.: US 10,566,359 B1
(45) Date of Patent: Feb. 18, 2020

(54) VARIABLY BIASED ISOLATION STRUCTURE FOR GLOBAL SHUTTER PIXEL STORAGE NODE

(71) Applicant: OmniVision Technologies, Inc., Santa Clara, CA (US)

(72) Inventor: Kevin Ka Kei Leung, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/109,225

(22) Filed: Aug. 22, 2018

(51) Int. Cl.
*H01L 27/146* (2006.01)
*H04N 5/341* (2011.01)
*H04N 5/353* (2011.01)
*H04N 5/3745* (2011.01)
*H04N 5/378* (2011.01)
*H01L 21/02* (2006.01)
*H01L 29/40* (2006.01)
*H01L 27/144* (2006.01)
*H01L 21/321* (2006.01)
(Continued)

(52) U.S. Cl.
CPC .. *H01L 27/14603* (2013.01); *H01L 21/02164* (2013.01); *H01L 21/02579* (2013.01); *H01L 21/3212* (2013.01); *H01L 21/32051* (2013.01); *H01L 21/765* (2013.01); *H01L 27/1443* (2013.01); *H01L 27/14612* (2013.01); *H01L 27/14623* (2013.01); *H01L 27/14643* (2013.01); *H01L 29/407* (2013.01); *H04N 5/341* (2013.01); *H04N 5/353* (2013.01); *H04N 5/378* (2013.01); *H04N 5/3745* (2013.01); *H01L 27/14689* (2013.01); *H01L 29/16* (2013.01)

(58) Field of Classification Search
None
See application file for complete search history.

(56) References Cited

U.S. PATENT DOCUMENTS 7,285,433 B2 10/2007 Kretchmer et al.
7,800,192 B2 9/2010 Venezia et al.
(Continued)

OTHER PUBLICATIONS

A. Tournier et al.,"Pixel-to-Pixel isolation by Deep Trench technology: Application to CMOS Image Sensor," STMicroelectronics, 850, rue Jean Monnet-F-38926 Crolles Cedex-France, pp. 1-4, Jun. 2011.

*Primary Examiner* — Cynthia Segura
(74) *Attorney, Agent, or Firm* — Christensen O'Connor; Johnson Kindness PLLC

(57) ABSTRACT

A pixel cell includes a photodiode disposed in a semiconductor material to accumulate image charge in response to incident light and a global shutter gate transistor coupled to the photodiode to selectively deplete the image charge from the photodiode. A storage transistor is disposed in the semiconductor material to store the image charge. An isolation structure is disposed in the semiconductor material proximate to the storage transistor to isolate a sidewall of the storage transistor from stray light and stray charge. The isolation structure is filled with tungsten and is coupled to receive a variable bias signal to control a bias of the isolation structure. The variable bias signal is set to a first bias value during a transfer of the image charge to the storage transistor. The variable bias signal is set to a second bias value during a transfer of the image charge from the storage transistor.

34 Claims, 4 Drawing Sheets

(51) Int. Cl.
*H01L 21/765* (2006.01)
*H01L 21/3205* (2006.01)
*H01L 29/16* (2006.01)

(56) References Cited

U.S. PATENT DOCUMENTS

| | | | |
|---|---|---|---|
| 8,089,036 | B2 | 1/2012 | Manabe |
| 8,294,203 | B2* | 10/2012 | Van Noort ............ H01L 21/763 |
| | | | 257/328 |
| 8,835,211 | B1* | 9/2014 | Chen ................. H01L 27/14806 |
| | | | 257/225 |
| 9,281,331 | B2 | 3/2016 | Chen et al. |
| 9,484,370 | B2* | 11/2016 | Leung ............... H01L 27/14609 |
| 9,549,140 | B2 | 1/2017 | Jung et al. |
| 10,141,360 | B2* | 11/2018 | Leung ............... H01L 27/14609 |
| 2005/0159007 | A1* | 7/2005 | Chen ................. H01L 21/02164 |
| | | | 438/700 |
| 2006/0043437 | A1* | 3/2006 | Mouli ................. H01L 27/1463 |
| | | | 257/291 |
| 2006/0180885 | A1 | 8/2006 | Rhodes |
| 2014/0291481 | A1 | 10/2014 | Zhang et al. |
| 2015/0236085 | A1 | 8/2015 | Dong et al. |
| 2016/0155768 | A1 | 6/2016 | Yi |
| 2016/0218131 | A1 | 7/2016 | Wang et al. |
| 2016/0268322 | A1* | 9/2016 | Watanabe ......... H01L 27/14614 |
| 2017/0018583 | A1* | 1/2017 | Leung ............... H01L 27/14609 |
| 2017/0154917 | A1* | 6/2017 | Lu ..................... H01L 27/14629 |
| 2018/0197910 | A1* | 7/2018 | Lee ........................ H04N 5/353 |

* cited by examiner

VARIABLY BIASED ISOLATION STRUCTURE FOR GLOBAL SHUTTER PIXEL STORAGE NODE

BACKGROUND INFORMATION

Field of the Disclosure

The present invention relates generally semiconductor processing. More specifically, examples of the present invention are related to semiconductor processing of image sensor pixel cells having global shutters.

Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects, the time differential between each row can generate image distortion. For fast-moving objects, a rolling shutter can cause a perceptible elongation distortion along the object's axis of movement.

To implement a global shutter, storage capacitors or storage transistors can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell. Factors that affect performance in an image sensor pixel cell having a global shutter include global shutter efficiency, dark current, white pixels, and image lag. In general, global shutter pixel performance improves as global shutter efficiency improves. Global shutter efficiency is a measure of how well signal charge can be stored in the storage node without being contaminated by parasitic light and/or electrical crosstalk.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
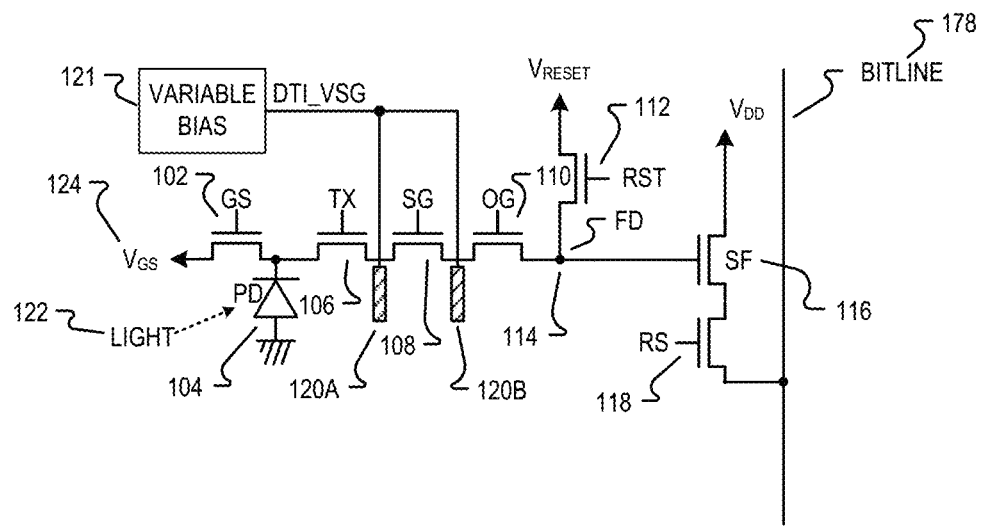
FIG. 1A is a schematic illustrating one example of a pixel cell with a global shutter pixel storage structure including variably biased isolation structures with in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses directed to a pixel cell with a global shutter pixel storage structure including biased switching isolation structures are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, a pixel cell with a global shutter pixel storage structure including variably biased isolation structures are disclosed. As will be discussed in further detail below, the variably biased isolation structures are filled with tungsten and isolate the sidewalls of a storage transistor of the global shutter pixel cell from parasitic stray light and/or stray charge from entering the storage transistor. Thus, global shutter efficiency (GSE) is improved because image charge stored in the storage transistor is isolated from contamination by parasitic stray light, which reduces electron hole pairs from being generated in the storage transistor as a result of the parasitic stray light. In addition, stray charge is prevented from entering the storage transistor, which reduces deep silicon electrical crosstalk in accordance with the teachings of the present invention. Furthermore, the isolation structures are coupled to receive a variable bias signal to control a bias of the isolation structure during operation of the pixel cell to further improve global shutter efficiency, reduce dark current, reduce lag in the transfer of image charge to the storage transistor, and reduce lag in the transfer of image charge from the storage transistor.

To illustrate, FIG. 1A is a schematic illustrating one example of a pixel cell 100A with a global shutter pixel storage structure including variably biased isolation structures in accordance with the teachings of the present invention. In the example, pixel cell 100A may be one of a plurality of pixel cells in a pixel array. As shown in the depicted example, pixel cell 100A includes a global shutter gate transistor 102, a photodiode 104, a transfer transistor 106, a storage transistor 108, an output transistor 110, a readout node 114, a reset transistor 112, an amplifier transistor 116, and a row select transistor 118 coupled to a bitline 178. In one example, the readout node 114 is a floating diffusion disposed in the semiconductor material of pixel cell 100A. In one example, the amplifier transistor 116 is implemented with a source follower coupled transistor. As shown in the example of FIG. 1A, global shutter gate transistor 102 is coupled between a $V_{GS}$ voltage and the photodiode 104.

In operation, the global shutter gate transistor 102 is coupled to selectively deplete the image charge that has accumulated in the photodiode 104 by selectively coupling the photodiode 104 to voltage $V_{GS}$ in response to a global shutter signal GS. The photodiode 104 is disposed in the semiconductor material pixel cell 100A to accumulate image charge in response to incident light 122 directed to the photodiode 104. In one example, the incident light 122 may be directed through a front side of the semiconductor material of pixel cell 100A. In another example, it is appreciated that the incident light 122 may be directed through a backside of the semiconductor material of pixel cell 100A. The image charge has accumulated in photodiode 104 is coupled to be transferred to an input of the storage transistor 108 through transfer transistor 106 in response to a transfer transistor control signal TX that is coupled to be received at a gate terminal of the transfer transistor 106.

In the depicted example, the storage transistor 108 is illustrated as being isolated in the semiconductor material of pixel cell 100A by a first isolation structure 120A and second isolation structure 120B. As will be discussed in further detail below, in one example, first and second isolation structures 120A and 120B are optically opaque isolation structures that are disposed proximate to the storage transistor 108 to block parasitic stray light and/or stray charge from entering storage transistor 108 from the surrounding area of storage transistor 108 to improve global shutter efficiency in accordance with the teachings of the present invention.

Pixel cell 100 also includes a variable bias circuit 121 coupled to generate a variable bias signal DTI_VSG. In the depicted example, the first and second isolation structures 120A and 120B are coupled to the variable bias circuit 121 to receive the variable bias signal DTI_VSG to control a bias of the first and second isolation structures 120A and 120B. As will be discussed, the control of the bias of the first and second isolation structures 120A and 120B with variable bias signal DTI_VSG during operation of the pixel cell 100A further improves global shutter efficiency, reduces dark current, reduces lag in the transfer of image charge to the storage transistor 108, and reduces lag in the transfer of image charge from the storage transistor 108 in accordance with the teachings of the present invention.

The example in FIG. 1A also illustrates that output transistor 110 is coupled to an output of the storage transistor 108 to selectively transfer the image charge from the storage transistor 108 to readout node 114, which in the illustrated example is a floating diffusion FD. A reset transistor 112 is coupled between a reset voltage $V_{RESET}$ and the readout node 114 to selectively reset the charge in the readout node 114 in response to a reset signal RST. In the example, amplifier transistor 116 includes an amplifier gate coupled to the readout node 114 to amplify the signal on readout node 114 to output image data from pixel cell 100A. Row select transistor 118 is coupled between bitline 178 and the amplifier transistor 116 to output the image data to bitline 178.

Figure 1B:
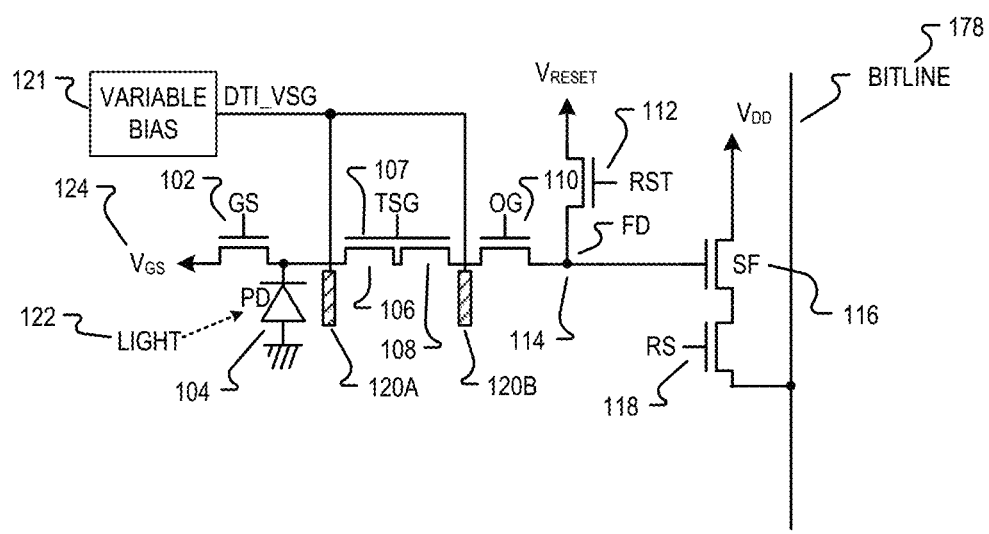
FIG. 1B is a schematic illustrating another example of a pixel cell with a global shutter pixel storage structure including variably biased isolation structures with in accordance with the teachings of the present invention.

FIG. 1B is a schematic illustrating another example of a pixel cell 100B with a global shutter pixel storage structure including variably biased isolation structures with in accordance with the teachings of the present invention. It is appreciated that example pixel cell 100B of FIG. 1B shares many similarities with example pixel cell 100A of FIG. 1A. Accordingly, it is appreciated that similarly named and numbered elements referenced below are coupled and function similar to as described above. One notable difference between the example pixel cell 100B of FIG. 1B and the example pixel cell 100A of FIG. 1A is that in pixel cell 100B of FIG. 1B, the gate terminal of the transfer transistor 106 is coupled to the gate terminal of the storage transistor 108. As such, the combined or connected gate terminal 107 of both the transfer transistor 106 and storage transistor 108 in the depicted example is coupled to receive the same transfer storage gate control signal TSG as shown. In addition, the first and second isolation structures 120A and 120B are disposed proximate to both the transfer transistor 106 and the storage transistor 108 in pixel cell 100B.

Figure 2:
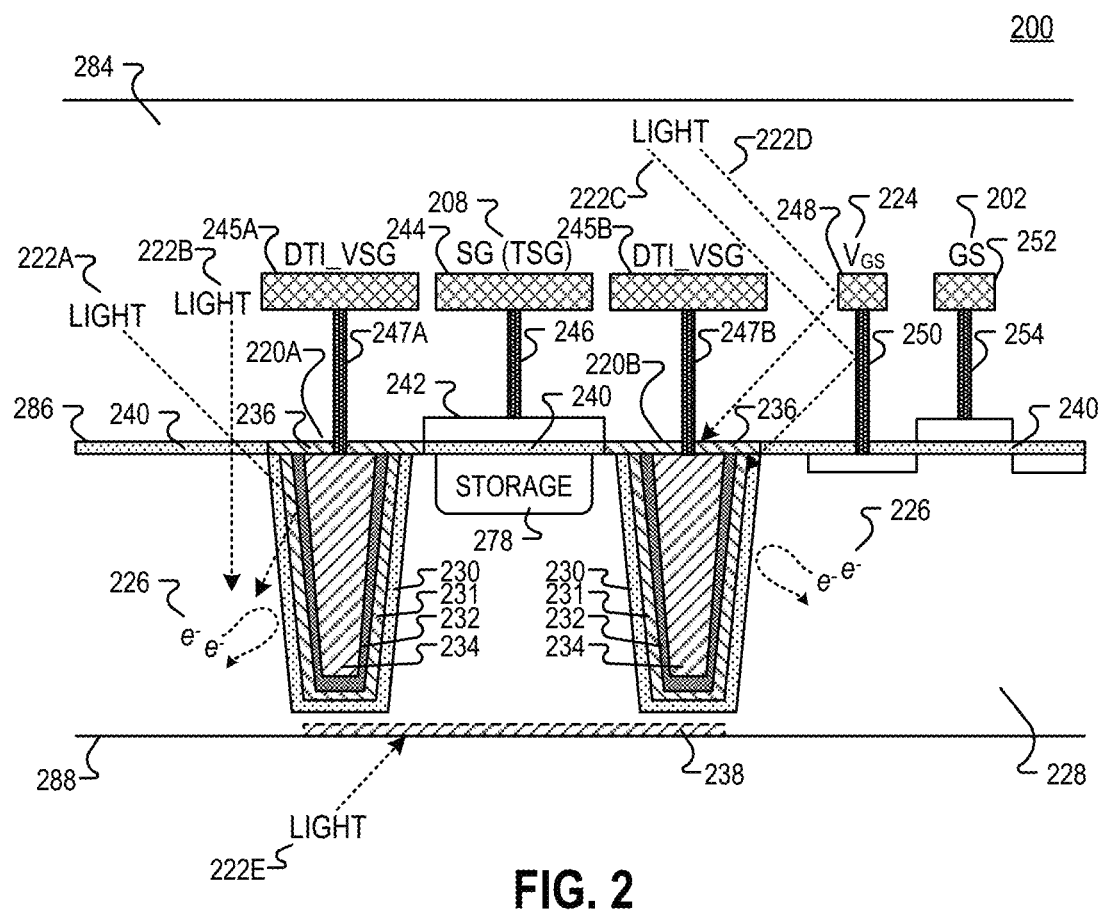
FIG. 2 is a cross-section view illustrating a portion of one example of a pixel cell with a global shutter pixel storage structure including variably biased isolation structures in accordance with the teachings of the present invention.

FIG. 2 is a cross-section view illustrating a portion of one example of a pixel cell 200 with a global shutter pixel storage structure including variably biased isolation structures in accordance with the teachings of the present invention. In the example, pixel cell 200 may be one of a plurality of pixel cells in a pixel array. It is noted that pixel cell 200 of FIG. 2 in one example is a cross-section view of a portion of pixel cell 100A of FIG. 1A and/or pixel cell 100B of FIG. 1B, and that similarly named and numbered elements referenced below are coupled and function similar to as described above. It is appreciated that the cross-section illustration of FIG. 2 does not intersect each and every element shown in FIG. 1A and/or FIG. 1B, and that therefore some elements illustrated in FIG. 1A or FIG. 1B, although present in pixel cell 200, may not be visible in the cross-section illustration of FIG. 2.

The example illustrated in FIG. 2 shows that pixel cell 200 includes a storage transistor 208 disposed in semiconductor material 228. In the example, storage transistor 208 includes a storage region 278 to store image charge that is accumulated by a photodiode (e.g., photodiode 104 in FIG. 1A or FIG. 1B) disposed in semiconductor material 228 in response to incident light directed to the photodiode. In one example, semiconductor material 228 may include silicon, and storage region 278 may be a storage diode of storage transistor 208 that is formed with doped silicon in the semiconductor material 228 under a storage gate 242, with a gate oxide 240 disposed between the storage gate 242 and the storage region 278.

The example shown in FIG. 2 shows that pixel cell 200 also includes other surrounding elements disposed in semiconductor material 228 outside of storage transistor 208. For instance, a global shutter gate transistor 202 is illustrated being disposed in semiconductor material 228. In the example, global shutter gate transistor 202 may be used to selectively deplete image charge from a photodiode also disposed in semiconductor material 228 by coupling voltage $V_{GS}$ 224 to the photodiode.

Pixel cell 200 also includes one or more isolation structures disposed in semiconductor material 228, such as for example isolation structures 220A and 220B, next to the storage transistor 208. As shown in the depicted example, isolation structures 220A and 220B are disposed in the semiconductor material 228 proximate to the storage transistor 208 to isolate a sidewall of the storage transistor 208 from parasitic stray light and/or stray charge in the semiconductor material 228 outside of the storage transistor 208 in accordance with the teachings of the present invention.

In one example, each isolation structure 220A and 220B is formed in semiconductor material 228 with deep trench isolation structures that are filled with tungsten 234. In one example, after deep trench isolation openings are formed in semiconductor material 208, and prior to filling the deep trench isolation openings with tungsten 234, a passivation layer 230 is formed on interior sidewalls of the deep trench isolation openings. In one example, the passivation layer 230 is a P+ passivation layer 230. In the example, after the passivation layer 230 is formed, a thin oxide 231 is formed on the interior sidewalls of the deep trench isolation openings over the passivation layer 230 as shown. A titanium nitride coating 232 is then formed on the interior sidewalls of the deep trench isolation openings over the thin oxide 231. In one example, the deep trench isolation openings are then filled with the tungsten 234 to form isolation structures 220A and 220B in accordance with the teachings of the present invention.

In one example, after the isolation structures 220A and 220B are filled with tungsten 234, chemical mechanical polishing (CMP) may be performed and then a protection layer 236 is formed over the isolation structures 220A and 220B. In one example, the protection layer 236 includes one of an oxide or a nitride, such as for example silicon nitride. The example shown in FIG. 2 also shows that vias including vias 246, 247A, 247B, 250, and 254, as well as metal conductors including metal conductors 244, 245A, 245B, 248, and 252 may be formed in an interlayer dielectric 284 proximate to front side 286 of the pixel cell 200 as shown. It is appreciated that the protection layer 236 over each isolation structure 220A and 220B protects the gate oxide 240 from being contaminated by the tungsten 234 of each isolation structure 220A and 220B in accordance with the teachings of the present invention.

In operation, each isolation structure 220A and 220B is an optically opaque isolation structure that blocks parasitic stray light and/or stray charge from entering the region of storage transistor 208 in semiconductor material 228. For instance, in an example in which pixel cell 200 is a front side illuminated pixel cell, FIG. 2 illustrates that stray light 222A entering front side 286 of semiconductor material 228 outside of storage transistor 208 is blocked by isolation structure 220A. Stray light 222B may enter semiconductor material 228 in areas outside of storage transistor 208, and consequently photogenerate electron hole pairs, including charge 226 as shown in FIG. 2. However, isolation structure 220A also blocks charge 226 from entering storage transistor 208 as shown.

The example depicted in FIG. 2 also illustrates that pixel cell 200 includes metal conductors and vias that are disposed in the interlayer dielectric 284 proximate to the front side 286 of semiconductor material 228. For instance, as shown in the illustrated example, metal conductors 244, 245A, 245B, 248, and 252 provide electrical connections through vias 246, 247A, 247B, 250, and 254 to the corresponding structures of the storage transistor 208, isolation structure 220A, isolation structure 220B, the $V_{GS}$ 224 coupling, and global shutter gate transistor 202, respectively, of pixel cell 200. It is appreciated that stray light may also be scattered by or deflected off of these structures. For instance, the example depicted in FIG. 2 shows that stray light 222C is deflected off of metal conductor 248 towards storage transistor 208, and that stray light 222D is deflected off of via 250 towards storage transistor 208. However, as shown, isolation structure 220B also blocks stray light 222C and 222D from entering storage transistor 208 in accordance with the teachings of the present invention.

Therefore, isolation structures 220A and 220B block stray light and/or stray charge from entering storage transistor 208 from surrounding areas in the semiconductor material 228 is in accordance with the teachings of the present invention. Indeed, no stray charges including photogenerated electron hole pairs can be generated in storage transistor 208. Accordingly, global shutter efficiency is improved in accordance with the teachings of the present invention.

In addition, the example depicted in FIG. 2 shows that metal conductors 245A and 245B are coupled to receive variable bias signal DTI_VSG to control the bias of isolation structures 220A and 220B proximate to the storage transistor 208. In one example, the variable bias signal DTI_VSG is received from a variable bias circuit (e.g., variable bias circuit 121 of FIG. 1A or FIG. 1B).

In one example, the variable bias signal DTI_VSG is set to be substantially equal to ground voltage (e.g., zero volts) during a global reset operation of the photodiode and storage transistor 208.

Continuing with the example, the variable bias signal DTI_VSG is then set to be a negative voltage while incident light is directed to the photodiode to accumulate image charge. It is appreciated that by biasing the isolation structures 220A and 220B with the negative voltage from the variable bias signal DTI_VSG during this exposure time, an electric field is created with the isolation structures 220A and 220B to stop electrons from accumulating in the substrate semiconductor material 228 and deeper regions of the storage region 278 of storage transistor 208. Hence, dark current is reduced, and global shutter efficiency is improved in accordance with the teachings of the present invention.

Continuing with the example, the variable bias signal DTI_VSG is then set to be a positive voltage during a transfer of the image charge to the storage transistor 208 from the photodiode through the transfer transistor. It is appreciated that by biasing the isolation structures 220A and 220B with the positive voltage from the variable bias signal DTI_VSG during this transfer of image charge to the storage transistor 208, an electric field is created with the isolation structures 220A and 220B that couples the transfer transistor to the storage transistor 208. Hence, by lowering the potential barrier between the transfer transistor and the storage transistor 208 with the positive voltage from the variable bias signal DTI_VSG, lag is reduced during the transfer of image charge to the storage transistor 208 in accordance with the teachings of the present invention.

Continuing with the example, the variable bias signal DTI_VSG is then set back to be the negative voltage while the image charge is stored in the storage transistor 208. As discussed previously, by biasing the isolation structures 220A and 220B with the negative voltage from the variable bias signal DTI_VSG while the image charge is stored in the storage transistor 208, the electric field created with the isolation structures 220A and 220B stops electrons from accumulating in the substrate semiconductor material 228 and deeper silicon region at the storage region 278 of storage transistor 208. Hence, dark current is reduced, and global shutter efficiency is improved in accordance with the teachings of the present invention.

Continuing with the example, the variable bias signal DTI_VSG is then set to a stronger negative voltage during a transfer of the image charge from the storage transistor 208 to the floating diffusion through the output transistor. In one example, the stronger negative voltage is greater in magnitude than the negative voltage of the variable bias signal DTI_VSG while the incident light is directed to the photodiode and while the image charge is stored in the storage transistor 208. By biasing the isolation structures 220A and 220B with the stronger negative voltage from the variable bias signal DTI_VSG while the image charge is transferred from the storage transistor 208, the electric field created with the isolation structures 220A and 220B pushes the electrons from the deeper regions of the storage region 278 of storage transistor 208 to flow out through the output transistor. Hence, lag is reduced during the transfer of image charge from the storage transistor 208 in accordance with the teachings of the present invention.

Continuing with the example, the variable bias signal DTI_VSG is then set back to be substantially equal to ground voltage (e.g., zero volts) during a sampling operation or readout of the image charge in floating diffusion of pixel cell 200.

In another example, it is appreciated that pixel cell 200 may be a backside illuminated pixel cell. In such an example it is appreciated that stray light may therefore enter semiconductor material 228 through a backside 288 of semiconductor material 228. In such an example, it is appreciated that a shield layer 238 may optionally be formed on the backside 288 of semiconductor material 228 over storage transistor 208 in accordance with the teachings of the present invention. As shown in the depicted example, stray light 222E is shielded by shield layer 238 from entering the backside 288 of semiconductor material 228 into storage transistor 208 in accordance with the teachings of the present invention. In one example, shield layer 238 may include a metal such as for example tungsten.

Figure 3:
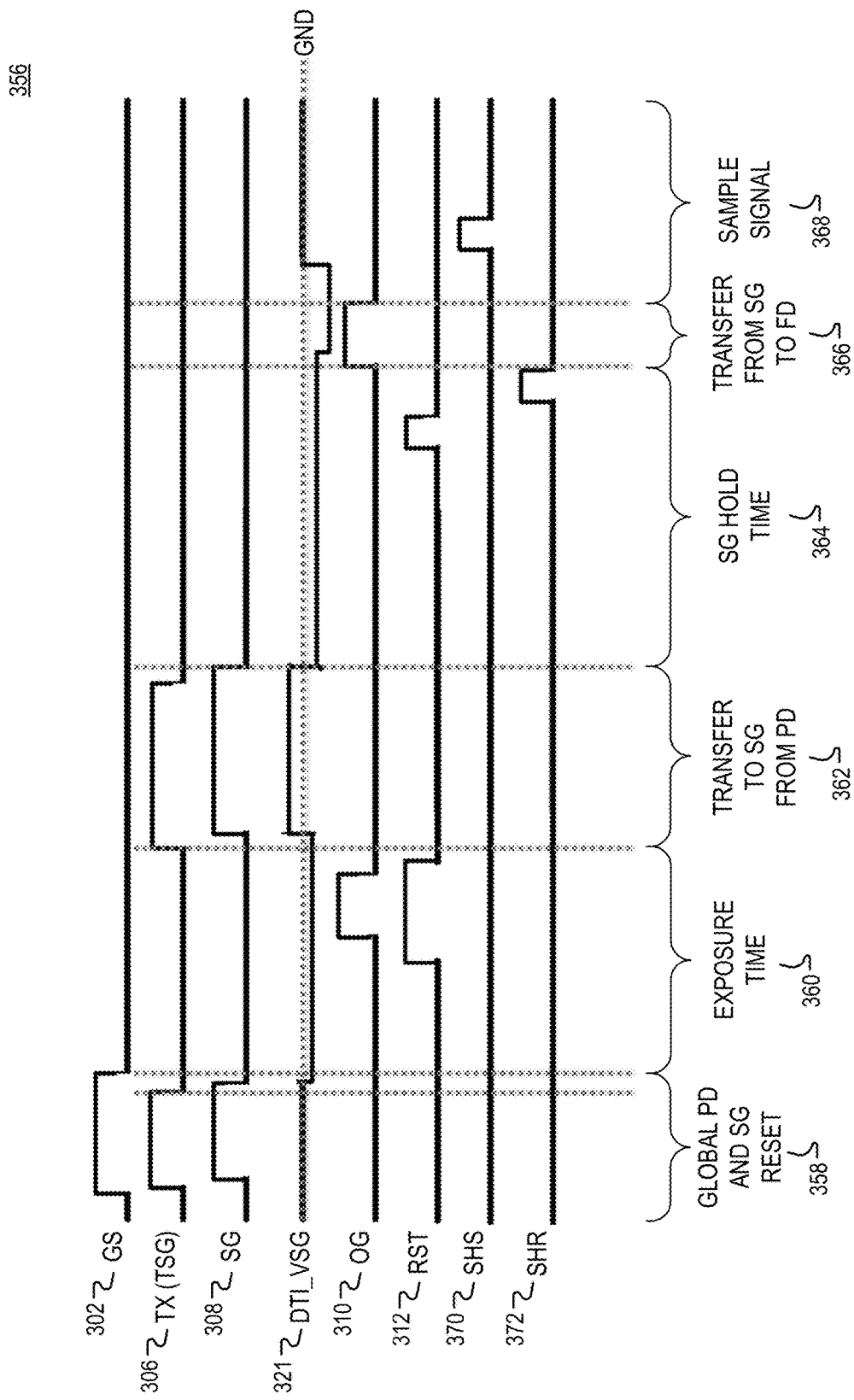
FIG. 3 is a timing diagram illustrating signal waveforms associated with a readout of a pixel cell with a global shutter pixel storage structure including variably biased isolation structures in accordance with the teachings of the present invention.

FIG. 3 is a timing diagram 356 illustrating signal waveforms associated with a readout of a pixel cell with a global shutter pixel storage structure including variably biased isolation structures in accordance with the teachings of the present invention. For instance, in one example, it is appreciated that pixel cell from which the waveforms described in timing diagram 356 may be a example of pixel cell 100A of FIG. 1A, pixel cell 100B of FIG. 1B, and/or pixel cell 200 of FIG. 2, and that similarly named or numbered elements referenced below are coupled and function similar to as described above.

As shown in the example depicted in FIG. 3, timing diagram 356 illustrates examples of a global shutter signal GS 302, a transfer/transfer storage gate signal TX (TSG) 306, a storage gate signal SG 308, a variable bias signal DTI_VSG 321, an output gate signal OG 310, a reset signal RST 312, a sample and hold signal pulse 370, and a sample and hold reset pulse 372 during operation of a pixel cell in accordance with the teachings of the present invention.

Initially, during a global photodiode and storage transistor reset operation 358, the global shutter signal GS 302, the transfer/transfer storage gate signal TX (TSG) 306, and the storage gate signal SG 308 are all logic high, while the output gate signal OG 310, the reset signal RST 312, the sample and hold signal pulse 370, and the sample and hold reset pulse 372 all remain logic low. The variable bias signal DTI_VSG 321 is substantially equal to a ground zero (e.g., zero volts). Thus, the GS gate, the TX gate, the SG gate, or the TSG gate (for a pixel cell design with TX and SG gates connected) are coupled together and pulsed to positive rail to turn on those gates, while the OG gate and the RST gate are coupled to a logic low to turn off those gates to reset photodiode and storage transistor.

During an exposure time operation 360 while the photodiode accumulates image charge in response to incident light, the global shutter signal GS 302, the transfer/transfer storage gate signal TX (TSG) 306, and the storage gate signal SG 308, the output gate signal OG 310, and the reset signal RST 312 are all set to logic low, while the variable bias signal DTI_VSG 321 is set to a negative voltage. Thus, the GS gate, the TX gate, the SG gate, or the TSG gate (for a pixel cell design with TX and SG gates connected), the OG gate, and the RST gate are coupled together to ground to ensure that the gates are closed. With variable bias signal DTI_VSG 321 set to the negative voltage during the exposure time operation 360, an electric field is created to stop electrons from accumulating in the substrate and deeper silicon regions at the storage node. Hence, dark current is reduced, and global shutter efficiency is improved in accordance with the teachings of the present invention. As shown in the depicted example, the output gate signal OG 310 and the reset signal RST 312 are also pulsed during the exposure time operation 360 to pre-charge the storage transistor just prior to the transfer of image charge to the storage transistor from the photodiode.

During a transfer to storage transistor from photodiode operation 362, the global shutter signal GS 302, the output gate signal OG 310, and the reset RST signal 312 are set to logic low, the transfer/transfer storage gate signal TX (TSG) 306 and the storage gate signal SG 308 are pulsed to logic high, and the variable bias signal DTI_VSG 321 is set to a positive voltage. Thus, the TX gate and the SG gate (or TSG gate) are coupled together and pulsed to a positive rail allowing electrons to transfer from the photodiode to the storage transistor, while the GS gate, the OG gate, and the RST gate are coupled to the logic low value to turn those gates off. With the variable bias signal DTI_VSG 321 set to the positive voltage during the transfer of image charge to the storage transistor from the photodiode, an electric field is created that couples the transfer transistor to the storage transistor. Hence, by lowering the potential barrier between the transfer transistor and the storage transistor with the positive voltage from the variable bias signal DTI_VSG 321, lag is reduced during the transfer of image charge to the storage transistor in accordance with the teachings of the present invention.

During a storage transistor hold time operation 364, the global shutter signal GS 302, the transfer/transfer storage gate signal TX (TSG) 306, the storage gate signal SG 308, the output gate signal OG 310, and the reset RST signal 312 are all set to logic low, while the variable bias signal DTI_VSG 321 is set back to the negative voltage. Thus, the GS gate, the TX gate, the SG gate, or the TSG gate (for a pixel cell design with TX and SG gates connected), the OG gate, and the RST gate are coupled together to ground to ensure that the gates are closed. With variable bias signal DTI_VSG 321 set back to the negative voltage during the storage transistor hold time operation 364, the resulting electric field that is created stops electrons from accumulating in the substrate and deeper silicon regions at the storage node, which reduces dark current, and improves global shutter efficiency in accordance with the teachings of the present invention. It is appreciated that during the storage transistor hold time operation 364, the pixel cells in the pixel array are all read out row by row, and that the storage transistor hold times may vary. It is also appreciated that in an example in which correlated double sampling (CDS) is implemented (as shown in FIG. 3), that the reset signal RST 312 is pulsed, and the sample and hold reset pulse 372 occurs as shown to sample a reset value from the floating diffusion just prior to the transfer of the image charge stored in the storage transistor to the floating diffusion.

During a transfer from storage transistor to floating diffusion operation 366, output gate signal OG 310 is set to logic high, and the global shutter signal GS 302, the transfer/transfer storage gate signal TX (TSG) 306, the storage gate signal SG 308, and the reset signal RST 312 are all set to logic low, while the variable bias signal DTI_VSG 321 is set to a stronger negative voltage. Thus, OG gate is coupled to a positive rail to turn it on, while the GS gate, the TX gate, the SG gate, or the TSG gate (for a pixel cell design with TX and SG gates connected), and the RST gate are coupled together to ground to ensure that those gates are closed. As such, the image charge stored in the storage transistor is now transferred to the floating diffusion through the output transistor. As shown in the example depicted in FIG. 3, the stronger negative voltage the variable bias signal DTI_VSG 321 during the transfer from storage transistor to floating diffusion operation 366 is greater in magnitude than the negative voltage of the variable bias signal DTI_VSG 321 while the image charge is stored in the storage transistor during the storage transistor hold time operation 364. With the stronger negative voltage from the variable bias signal DTI_VSG 321 during the transfer from storage transistor to floating diffusion operation 366, the resulting electric field pushes the electrons from the deeper regions of the storage node to flow out through the output transistor, which reduces lag during the transfer of image charge from the storage transistor in accordance with the teachings of the present invention.

During a sample signal operation 368, the global shutter signal GS 302, the transfer/transfer storage gate signal TX (TSG) 306, the storage gate signal SG 308, the output gate signal OG 310, and the reset signal RST 312 are all set to logic low, while the variable bias signal DTI_VSG 321 is set back to be substantially equal to the ground voltage (e.g., zero volts). Thus, the GS gate, the TX gate, the SG gate, or the TSG gate (for a pixel cell design with TX and SG gates connected), the OG gate, and the RST gate are coupled together to ground to ensure that the gates are closed. As shown in the depicted example, the sample and hold signal SHS 370 is pulsed during the sample signal operation 368 to sample the image charge value from the floating diffusion to read out the image data information from the pixel cell. In an example in which correlated double sampling (CDS) is implemented, the reset value sampled in response to the sample and hold reset pulse 372 is subtracted from the image charge value sampled in response to the sample and hold signal pulse 370 to provide a calibrated image data value from the pixel cell in accordance with the teachings of the present invention.

Figure 4:
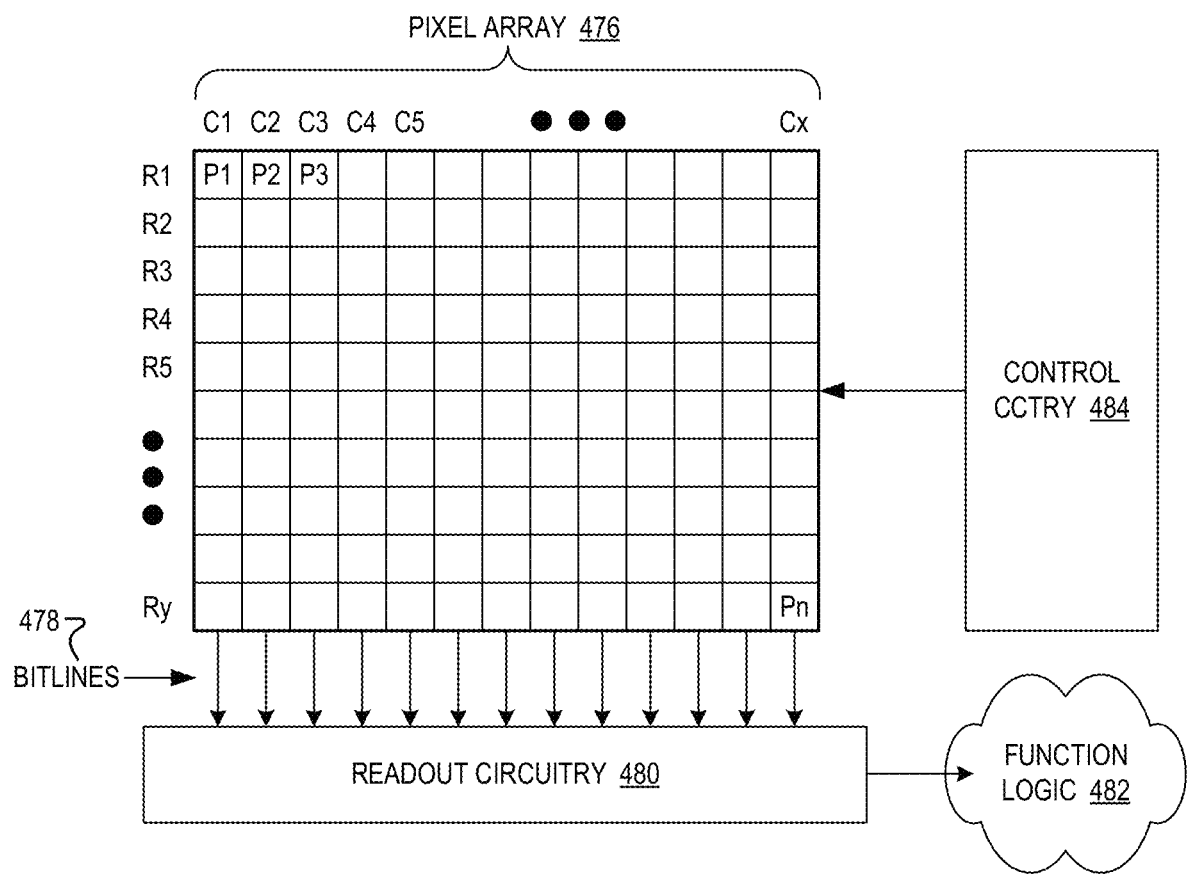
FIG. 4 is a diagram illustrating one example of an imaging system including a pixel array having pixel cells with a global shutter pixel storage structures including variably biased isolation structures in accordance with the teachings of the present invention.

FIG. 4 is a diagram illustrating one example of an imaging system 474 including an example pixel array 476 having a plurality of image sensor pixels cells with global shutter pixel storage structures including variably biased isolation structures in accordance with the teachings of the present invention. As shown in the depicted example, imaging system 474 includes pixel array 476 coupled to control circuitry 484 and readout circuitry 480, which is coupled to function logic 482.

In one example, pixel array 476 is a two-dimensional (2D) array of image sensor pixel cells (e.g., pixels P1, P2, P3, . . . , Pn). It is noted that the pixel cells P1, P2, . . . Pn in the pixel array 476 may be examples of pixel cell 100A of FIG. 1A, pixel cell 100B of FIG. 1B, pixel cell 200 of FIG. 2, and/or the pixel cell described in FIG. 3, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell P1, P2, P3, . . . , Pn has acquired its image data or image charge, the image data is readout by readout circuitry 480 through bitlines 478 and then transferred to function logic 482. In various examples, readout circuitry 480 may include amplification circuitry, analog-to-digital (ADC) conversion circuitry, or otherwise. Function logic 482 may simply store the image data or even manipulate the image data by applying post image effects (e.g., crop, rotate, remove red eye, adjust brightness, adjust contrast, or otherwise). In one example, readout circuitry 480 may readout a row of image data at a time along readout column lines (illustrated) or may readout the image data using a variety of other techniques (not illustrated), such as a serial readout or a full parallel readout of all pixels simultaneously.

In one example, control circuitry 484 is coupled to pixel array 476 to control operational characteristics of pixel array 476. In one example, control circuitry 484 is coupled to generate the global shutter signal and control signals discussed above for controlling image acquisition for each pixel cell. In the example, the global shutter signal and control signals simultaneously enable all pixels cells P1, P2, P3, . . . Pn within pixel array 476 to transfer the image charge from each respective photodiode during a single acquisition window.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a photodiode disposed in a semiconductor material to accumulate image charge in response to incident light directed to the photodiode;
   a global shutter gate transistor disposed in the semiconductor material and coupled to the photodiode to selectively deplete the image charge from the photodiode;
   a storage transistor disposed in the semiconductor material to store the image charge; and
   an isolation structure disposed in the semiconductor material proximate to the storage transistor to isolate a sidewall of the storage transistor from stray light and stray charge in the semiconductor material outside of the storage transistor, wherein the isolation structure is filled with tungsten, wherein the isolation structure is coupled to receive a variable bias signal to control a bias of the isolation structure, wherein the variable bias signal is set to a first bias value during a transfer of the image charge to the storage transistor, and wherein the variable bias signal is set to a second bias value during a transfer of the image charge from the storage transistor.

2. The pixel cell of claim 1, wherein the variable bias signal is set a third bias value while the incident light is directed to the photodiode to accumulate the image charge, and wherein the variable bias signal is set the third bias value while the image charge is stored in the storage transistor.

3. The pixel cell of claim 2, wherein the variable bias signal is set a fourth bias value during a reset of the storage transistor, and wherein the variable bias signal is set the fourth bias during a sampling of the image charge from the pixel cell.

4. The pixel cell of claim 3, further comprising a variable bias circuit coupled to generate the variable bias signal, wherein the first bias value is equal to a positive voltage, wherein the third bias value is equal to a negative voltage, wherein the second bias value is equal to a strong negative voltage, wherein the strong negative voltage of the second bias value is greater in magnitude than the negative voltage of the third bias value, and wherein the fourth bias value is equal to a ground voltage.

5. The pixel cell of claim 1, wherein the isolation structure is one of a plurality of isolation structures disposed in the semiconductor material proximate to the storage transistor to isolate the sidewall of storage transistor from the stray light and the stray charge in the semiconductor material outside of the storage transistor, and coupled to receive the variable bias signal to control the bias of the isolation structure.

6. The pixel cell of claim 5, further comprising a transfer transistor disposed in the semiconductor material and coupled between the photodiode and an input of the storage transistor to selectively transfer the image charge from the photodiode to the storage transistor.

7. The pixel cell of claim 6, wherein a gate terminal of the transfer transistor is coupled to a gate terminal of the storage transistor, wherein the plurality of isolation structures disposed in the semiconductor material are disposed proximate to the storage transistor and the transfer transistor.

8. The pixel cell of claim 1, further comprising an output transistor disposed in the semiconductor material and coupled to an output of the storage transistor to selectively transfer the image charge from the storage transistor to a readout node.

9. The pixel cell of claim 8, wherein the readout node comprises a floating diffusion disposed in the semiconductor material.

10. The pixel cell of claim 8, further comprising:
    a reset transistor disposed in the semiconductor material and coupled to the readout node;
    an amplifier transistor disposed in the semiconductor material having an amplifier gate coupled to the readout node; and
    a row select transistor disposed in the semiconductor material coupled between a bitline and the amplifier transistor.

11. The pixel cell of claim 1, wherein the isolation structure includes a deep trench isolation structure formed in the semiconductor material, wherein the deep trench isolation structure is filled with the tungsten.

12. The pixel cell of claim 11, wherein the isolation structure further comprises a P+ passivation formed over an interior sidewall of the deep trench isolation structure between the tungsten and the semiconductor material.

13. The pixel cell of claim 12, wherein the isolation structure further comprises a thin oxide formed over the P+ passivation between the semiconductor material and the tungsten.

14. The pixel cell of claim 13, wherein the isolation structure further comprises a titanium nitride coating formed over the thin oxide between the tungsten and the semiconductor material.

15. The pixel cell of claim 1, further comprising:
    a gate oxide layer disposed over the semiconductor material between a storage gate of the storage transistor and a storage region of the storage transistor in the semiconductor material; and
    a protection layer disposed over the isolation structure and proximate to the storage transistor to protect the gate oxide layer from being contaminated by the tungsten of the isolation structure, wherein the protection layer disposed over the isolation structure comprises one of an oxide or a nitride.

16. The pixel cell of claim 1, wherein the incident light is directed to the photodiode through a front side of the semiconductor material.

17. The pixel cell of claim 1, wherein the incident light is directed to the photodiode through a backside of the semiconductor material, wherein the pixel cell further comprises a shield layer disposed over the backside of the semiconductor material over the storage transistor to shield the storage transistor from the stray light.

18. An imaging system, comprising:
    a pixel array of pixel cells, wherein each one of the pixel cells includes:
    a photodiode disposed in a semiconductor material to accumulate image charge in response to incident light directed to the photodiode;
    a global shutter gate transistor disposed in the semiconductor material and coupled to the photodiode to selectively deplete the image charge from the photodiode;
    a storage transistor disposed in the semiconductor material to store the image charge; and
    an isolation structure disposed in the semiconductor material proximate to the storage transistor to isolate a sidewall of the storage transistor from stray light and stray charge in the semiconductor material outside of the storage transistor, wherein the isolation structure is filled with tungsten, wherein the isolation structure is coupled to receive a variable bias signal to control a bias of the isolation structure, wherein the variable bias signal is set to a first bias value during a transfer of the image charge to the storage transistor, and wherein the variable bias signal is set to a second bias value during a transfer of the image charge from the storage transistor;

control circuitry coupled to the pixel array to control operation of the pixel array; and readout circuitry coupled to the pixel array to readout image data from the plurality of pixels.

19. The imaging system of claim 18, further comprising function logic coupled to the readout circuitry to store the image data from each one of the plurality of pixel cells.

20. The imaging system of claim 18, wherein the control circuitry is coupled to simultaneously enable all of the pixel cells in pixel array to simultaneously transfer the image charge from each respective photodiode during a single acquisition window.

21. The imaging system of claim 18, wherein the variable bias signal is set a third bias value while the incident light is directed to the photodiode to accumulate the image charge, and wherein the variable bias signal is set the third bias value while the image charge is stored in the storage transistor.

22. The imaging system of claim 21, wherein the variable bias signal is set a fourth bias value during a reset of the storage transistor, and wherein the variable bias signal is set the fourth bias during a sampling of the image charge from the pixel cell.

23. The imaging system of claim 22, further comprising a variable bias circuit coupled to generate the variable bias signal, wherein the first bias value is equal to a positive voltage, wherein the third bias value is equal to a negative voltage, wherein the second bias value is equal to a strong negative voltage, wherein the strong negative voltage of the second bias value is greater in magnitude than the negative voltage of the third bias value, and wherein the fourth bias value is equal to a ground voltage.

24. The imaging system of claim 18, wherein the isolation structure is one of a plurality of isolation structures disposed in the semiconductor material proximate to the storage transistor to isolate the sidewall of storage transistor from the stray light and the stray charge in the semiconductor material outside of the storage transistor, and coupled to receive the variable bias signal to control the bias of the isolation structure.

25. The imaging system of claim 24, wherein each one of the pixel cells further comprises a transfer transistor disposed in the semiconductor material and coupled between the photodiode and an input of the storage transistor to selectively transfer the image charge from the photodiode to the storage transistor.

26. The imaging system of claim 25, wherein a gate terminal of the transfer transistor is coupled to a gate terminal of the storage transistor, wherein the plurality of isolation structures disposed in the semiconductor material are disposed proximate to the storage transistor and the transfer transistor.

27. The imaging system of claim 18, wherein each one of the pixel cells further comprises an output transistor disposed in the semiconductor material and coupled to an output of the storage transistor to selectively transfer the image charge from the storage transistor to a readout node.

28. The imaging system of claim 27, wherein the readout node comprises a floating diffusion disposed in the semiconductor material.

29. The imaging system of claim 27, wherein each one of the pixel cells further comprises:

a reset transistor disposed in the semiconductor material and coupled to the readout node;

an amplifier transistor disposed in the semiconductor material having an amplifier gate coupled to the readout node; and a row select transistor disposed in the semiconductor material coupled between a bitline and the amplifier transistor.

30. The imaging system of claim 18, wherein the isolation structure includes a deep trench isolation structure formed in the semiconductor material, wherein the deep trench isolation structure is filled with the tungsten.

31. The imaging system of claim 30, wherein the isolation structure further comprises a P+ passivation formed over an interior sidewall of the deep trench isolation structure between the tungsten and the semiconductor material.

32. The imaging system of claim 31, wherein the isolation structure further comprises a thin oxide formed over the P+ passivation between the semiconductor material and the tungsten.

33. The imaging system of claim 32, wherein the isolation structure further comprises a titanium nitride coating formed over the thin oxide between the tungsten and the semiconductor material.

34. The imaging system of claim 18, wherein each one of the pixel cells further comprises:

a gate oxide layer disposed over the semiconductor material between a storage gate of the storage transistor and a storage region of the storage transistor in the semiconductor material; and a protection layer disposed over the isolation structure and proximate to the storage transistor to protect the gate oxide layer from being contaminated by the tungsten of the isolation structure, wherein the protection layer disposed over the isolation structure comprises one of an oxide or a nitride.

* * * * *